US007060574B2

(12) United States Patent
Kim et al.

(10) Patent No.: US 7,060,574 B2
(45) Date of Patent: Jun. 13, 2006

(54) BURIED CHANNEL TYPE TRANSISTOR HAVING A TRENCH GATE AND METHOD OF MANUFACTURING THE SAME

(75) Inventors: Ji-Young Kim, Gyeonggi-do (KR); Chang-Sub Lee, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/839,951

(22) Filed: May 5, 2004

(65) Prior Publication Data

US 2004/0222457 A1   Nov. 11, 2004

(30) Foreign Application Priority Data

May 7, 2003 (KR) .................. 10-2003-0029156

(51) Int. Cl.
*H01L 21/336* (2006.01)
(52) U.S. Cl. .................. 438/297; 438/302; 438/306; 257/328
(58) Field of Classification Search ............... 438/297, 438/298, 303, 307, 291; 257/328
See application file for complete search history.

(56) References Cited

U.S. PATENT DOCUMENTS

| 5,620,911 A * | 4/1997 | Park ..................... 438/297 |
| 5,828,100 A * | 10/1998 | Tamba et al. ........... 257/328 |
| 5,828,103 A * | 10/1998 | Hsu ...................... 257/344 |
| 6,316,806 B1 | 11/2001 | Mo |
| 2002/0038886 A1 | 4/2002 | Mo |

FOREIGN PATENT DOCUMENTS

| JP | 2001-339063 | 12/2001 |
| WO | WO 02/057506 A2 | 7/2002 |

OTHER PUBLICATIONS

English language Abstract from WO patent publication No. WO 02/057506 A2.
English Language Abstract from Japanese patent publication No. JP2001-339063.

* cited by examiner

*Primary Examiner*—Edward Wojciechowicz
(74) *Attorney, Agent, or Firm*—Marger Johnson & McCollom, P.C.

(57) ABSTRACT

In a method of manufacturing a buried channel type transistor, a trench is formed at a surface portion of a substrate. A first and a second threshold voltage control regions are formed at portions of the substrate beneath a bottom face of the trench and adjacent to a sidewall of the trench, respectively. A gate electrode filling the trench is formed. Source/drain regions are formed at portions of the substrate adjacent to the sidewall of the gate electrode. Stopper regions are formed at portions of the substrate beneath the source/drain regions and beneath the first and second threshold voltage control regions, respectively. The buried channel type transistor has a high breakdown voltage between the source/drain regions although a threshold voltage thereof is low.

14 Claims, 7 Drawing Sheets

BURIED CHANNEL TYPE TRANSISTOR HAVING A TRENCH GATE AND METHOD OF MANUFACTURING THE SAME

CROSS REFERENCE TO RELATED APPLICATION

This application claims priority under 35 USC § 119 to Korean Patent Application No. 2003-29156, filed on May 7, 2003, the contents of which are herein incorporated by reference in their entirety for all purposes.

BACKGROUND OF THE INVENTION

1. Field of the Invention

The present invention relates to a buried channel type transistor having a trench gate and a method of manufacturing the buried channel type transistor. More particularly, the present invention relates to a buried channel type transistor having a trench gate, and a method of manufacturing the buried channel type transistor.

2. Description of the Related Art

As semiconductor devices are highly integrated, sizes of active regions on which MOS transistor are formed may be greatly reduced. Thus, the MOS transistor formed in the active region has a channel length well below a micrometer ($\mu$m). When the MOS transistor has a reduced channel length, a source and a drain of the transistor may strongly affect an electric field or a voltage of the channel region. This affect is referred to as "short channel effect." For example, the short channel effect includes the decrease of a threshold voltage (Vth) of the gate electrode. The threshold voltage decrease of the gate electrode may be generated in accordance with the reduction of the length of the channel region because the channel region may be greatly affected by the voltage of the gate as well as charges, electric fields or voltage distribution in the depletion layers of the source/drain regions. The short channel effect additionally includes the decrease of a breakdown voltage between the source/drain regions. The depletion layer of the drain region increases in proportion to the increase of the voltage of the drain region. When the gate has greatly reduced length, the depletion layer of the drain region may contact the depletion layer of the source region. In this state, the electric field of the drain region may affect on the source region so that the diffusion voltage near the source region may be reduced. As a result, a current may flow between the source region and the drain region without the formation of the channel region. This phenomenon is referred to as "punch-through." When punch-through occurs, the current of the drain region may be rapidly increased at a saturation region.

In the meantime, a conventional MOS transistor includes a gate electrode formed using an N type polysilicon layer in which impurities such as phosphorus (P) are heavily implanted. Although a recent MOS transistor has a polycide structure of metal silicide and polysilicon, the MOS transistor includes an N type polysilicon layer that directly contacts a gate oxide layer formed on a substrate. When an N-MOS transistor includes the above-mentioned gate electrode, a threshold voltage of the gate electrode may be reduced because the difference of work functions between the N type polysilicon layer and a P-type semiconductor substrate is relative large. To solve this problem, P type impurities may be generally implanted into a channel region of the N-MOS transistor.

On the other hand, when an N+ type polysilicon layer is used as a gate electrode of a P-MOS transistor, a threshold voltage of the gate electrode may have negative value because of the difference between work functions of the N+ type polysilicon layer and the N type semiconductor substrate. In order to adjust an absolute value of the threshold voltage of the P-MOS transistor to be substantially identical to that of the N-MOS transistor, impurities opposite to those of the substrate may be implanted into the channel region of the P-MOS transistor, thereby reducing the absolute value of the threshold voltage of the P-MOS transistor. As a result, a very shallow p-n junction may be formed in the channel region of the P-MOS transistor including the N type polysilicon layer as the gate electrode, thereby forming a buried channel type P-MOS transistor. The very shallow p-n junction, however, may also be formed in the channel region of the N-MOS transistor including the N type polysilicon layer as the gate electrode, thereby forming a surface channel type N-MOS transistor.

The buried channel type P-MOS transistor has advantages in that carriers in the channel region may not be affected by surface scattering, and the mobility of the carriers may be increased. It, however, has disadvantages in that a gate voltage of the buried channel type P-MOS transistor may be decreased and a short channel effect may easily occur in the buried channel type P-MOS transistor because a p-n junction is not formed near a boundary between a silicon substrate. Furthermore, a gate oxide layer and a drain voltage may strongly affect the channel region. To lessen the above-mentioned problems, a stopper is formed beneath the channel region of the buried channel type P-MOS transistor to reduce the short channel effect.

FIG. 1 is a cross-sectional view illustrating a conventional buried channel type P-MOS transistor having a plan structure.

Referring to FIG. 1, a P type well (not shown) and an N type well 12 are formed in a P type semiconductor substrate 10. An N-MOS transistor is formed on the P type well, whereas a P-MOS transistor is formed on the N type well 12 to independently optimize the N-MOS transistor and the P-MOS transistor.

P type impurities such as boron (B) generated from boron bifluoride ($BF_2$) are implanted into a channel region of the substrate 10 so as to form a threshold voltage control region 16 that adjusts a threshold voltage of the P-MOS transistor to be substantially identical to that of the N-MOS transistor.

A stopper 14 is formed by heavily implanting N type impurities such as arsenic (As) into a portion of the substrate 10 beneath the channel region. The stopper 14 prevents surface depletion of the threshold voltage control region 16. The stopper 14 has a high impurity concentration, which reduces punch-through by preventing a current of a drain from permeating into the channel region and a source region.

After a gate insulation layer 18 is formed on the substrate 10, a gate electrode 20 is formed on the gate insulation layer 18 using N type polysilicon. Here, the N-MOS and the P-MOS transistors have the N type gate electrodes 20.

A gate spacer 22 is formed on a sidewall of the gate electrode 20 using silicon oxide.

N+ type source/drain regions are formed in a portion of the P type well adjacent to the gate electrode 20 using N type impurities such as arsenic, whereas P+ type source/drain regions 24 are formed in a portion of the N well 12 adjacent to the gate electrode 20 using P type impurities such as boron.

In the conventional buried channel type P-MOS transistor, in order to reduce a short channel effect, the stopper 14 is formed beneath the channel region or a junction depth of the source/drain regions is decreased.

Meanwhile, a highly integrated semiconductor device includes a dual gate structure in which an N-MOS transistor has an N type polysilicon gate and a P-MOS transistor has a P type polysilicon gate to reduce a short channel effect of the P-MOS transistor. However, manufacturing processes for the dual gate structure may be complicated and manufacturing cost for forming the dual gate structure may be greatly increased because the N-MOS transistor and the P-MOS transistor are separately formed using additional photo masks and additional photolithography processes.

Recently, several vertical type MOS transistors having trench gate electrodes have been disclosed in U.S. Laid Open Patent Publication No. 2002-38886, U.S. Pat. No. 6,316,806 and Japanese Laid Open Patent Publication No. 2001-339063. The MOS transistor having the trench gate electrode may have a sufficient breakdown voltage between source/drain regions thereof, and may reduce a short channel effect because a recess type channel thereof may augment a length of a channel. However, these conventional MOS transistors with trench gate electrodes includes a surface channel region only. Thus, there is still a requirement to develop a buried channel type P-MOS transistor that includes an N type polysilicon gate electrode in a trench.

Embodiments of the invention address these and other disadvantages of the conventional art.

SUMMARY OF THE INVENTION

The present invention provides a buried channel type MOS transistor having a trench gate or a recess.

The present invention also provides a method of manufacturing a buried channel type MOS transistor having a trench gate or a recess.

In accordance with one aspect of the present invention, there is provided a buried channel type transistor includes a semiconductor substrate, a trench of a predetermined depth formed on the substrate, a first threshold voltage control region having a first conduction type formed at a portion of the substrate beneath a bottom face of the trench, a second threshold voltage control region having the first conduction type formed at a portion of the substrate adjacent to a sidewall of the trench, a gate electrode filling the trench, source/drain regions formed at portions of the substrate adjacent to the sidewall of the gate electrode, and stopper regions formed beneath the source/drain regions and beneath the first and second threshold voltage control regions. Here, each of the stopper regions has a second conduction type opposed to the first conduction type. Preferably, the first conduction type is a P type and the second conduction type is an N type.

In accordance with another aspect of the present invention, there is provided a method of manufacturing a buried channel type transistor. In the method, a trench of a predetermined depth is formed on a semiconductor substrate. Stopper regions are formed at portions of the substrate. Each of the stopper regions has a first conduction type. A first and a second threshold voltage control regions are formed at portions of the substrate beneath a bottom face of the trench and adjacent to a sidewall of the trench, respectively. Each of the threshold voltage control regions has a second conduction type opposed to the first conduction type. After forming a gate electrode filling the trench, source/drain regions are formed at portions of the substrate adjacent to a sidewall of the gate electrode. Each of the source/drain regions has the second conduction type. Here, the first conduction type is an N type and the second conduction type is a P type. Preferably, preliminary source/drain regions may be formed on the substrate before forming the trench wherein each of the preliminary source/drain regions has the second conduction type.

According to the present invention, the stopper regions prevent surface depletions of the threshold voltage control regions adjacent to the sidewall and bottom face of the trench. The stopper regions also prevent diffusion of impurities included in the source/drain regions. In addition, the threshold voltage control regions prevent the increase of a threshold voltage of the channel region formed adjacent to the sidewall of the trench due to the formation of the stopper regions. Furthermore, a buried channel type transistor having the recess type channel regions may be easily manufactured because several ion implantation processes for the formations of a well, the stopper regions, source/drain regions may be performed in one chamber.

BRIEF DESCRIPTION OF THE DRAWINGS

The above and other features and advantages of the present invention will become readily apparent by reference to the following detailed description when considered in conjunction with the accompanying drawings.

DETAILED DESCRIPTION OF THE INVENTION

Figure 1:
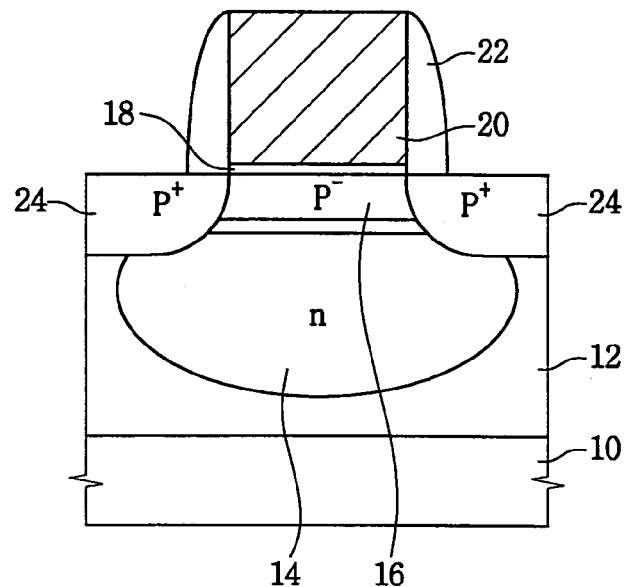
FIG. 1 is a cross-sectional view illustrating a conventional buried channel type P-MOS transistor.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

Figure 2:
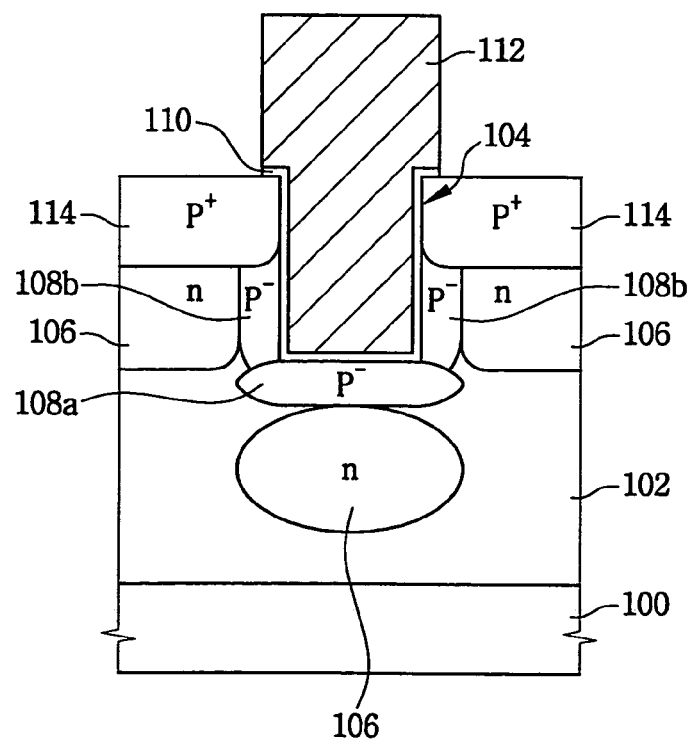
FIG. 2 is a cross-sectional view illustrating a buried channel type P-MOS transistor in accordance with some embodiments of the present invention.

FIG. 2 is a cross-sectional view illustrating a buried channel type P-MOS transistor in accordance with some embodiments of the present invention.

Referring to FIG. 2, an N type well 102 is formed in a P type semiconductor substrate 100. A P-MOS transistor is formed on the N-type well 102.

A trench 104 having a predetermined depth is formed at a surface portion of the substrate 100 including the N type well 102.

A gate electrode 112 filling the trench 104 is formed on the substrate 100. The gate electrode 112 includes N+ type polysilicon. The gate electrode 112 filling the trench 104 has a predetermined height from a surface of the substrate 100.

A gate insulation layer 110 is formed between the gate electrode 112 and the trench 104. The gate insulation layer 110 includes oxide or oxynitride. For example, the gate insulation layer 110 includes silicon oxide or silicon oxynitride. Here, an upper portion of the gate electrode 112 extends slightly in a direction substantially parallel to the substrate 100. The gate insulation layer 110 is formed beneath the upper portion of the gate electrode 112.

P+ type source/drain regions 114 are formed at portions of the substrate 100 adjacent to the gate electrode 112. The gate insulation layer 110 separates the upper portion of the gate electrode 112 from the source/drain regions 114.

A first threshold voltage (Vth) control region 108a and a second threshold voltage control region 108b are formed at portions of the substrate 100 adjacent to a sidewall and a bottom face of the trench 104. These portions of the substrate 100 are referred to as "recess type channel regions". The first and second threshold voltage control regions 108a and 108b have P– types, respectively. Here, the first threshold voltage control region 108a is positioned beneath the bottom face of the trench 104. The second threshold voltage control region 108b is positioned on both sides of the trench 104. The second threshold voltage control region 108b reduces the threshold voltages of channels formed adjacent to the trench 104.

N type stopper regions 106 are formed adjacent to the recess channel regions and beneath the source/drain regions 114. That is, the N type stopper regions 106 are positioned in the N type well 102 beneath the source/drain regions 114 and beneath the first threshold voltage control region 108a. The N type stopper regions 106 prevent surface depletions of the first and second threshold control regions 108a and 108b that are generated adjacent to the sidewall and the bottom face of the trench 104. In addition, the N type stopper regions 106 prevent diffusions of P type impurities implanted in the source/drain regions 114.

FIGS. 3A to 3D are cross-sectional views illustrating a method of manufacturing the buried channel type P-MOS transistor having a trench gate that is illustrated in FIG. 2.

Figure 3A:
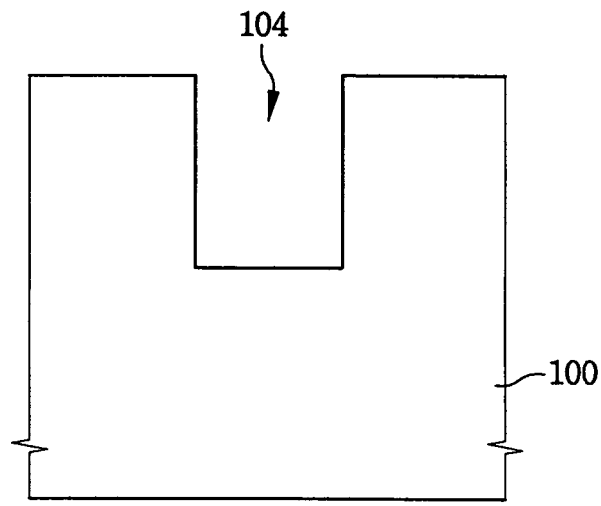
FIGS. 3A to 3D are cross-sectional views illustrating a method of manufacturing the buried channel type P-MOS transistor having a trench gate of FIG. 2.

FIG. 3A illustrates a process of forming a trench 104 on a semiconductor substrate 100.

Referring to FIG. 3A, after the P type semiconductor substrate 100 is provided, the substrate 100 is divided into an active region and a field region by an isolation process.

A surface portion of the substrate 100 is anisotropically etched to form the trench 104 having a depth of about 1,000 to about 1,500 Å. Preferably, the trench 104 has a vertical sidewall.

Figure 3B:
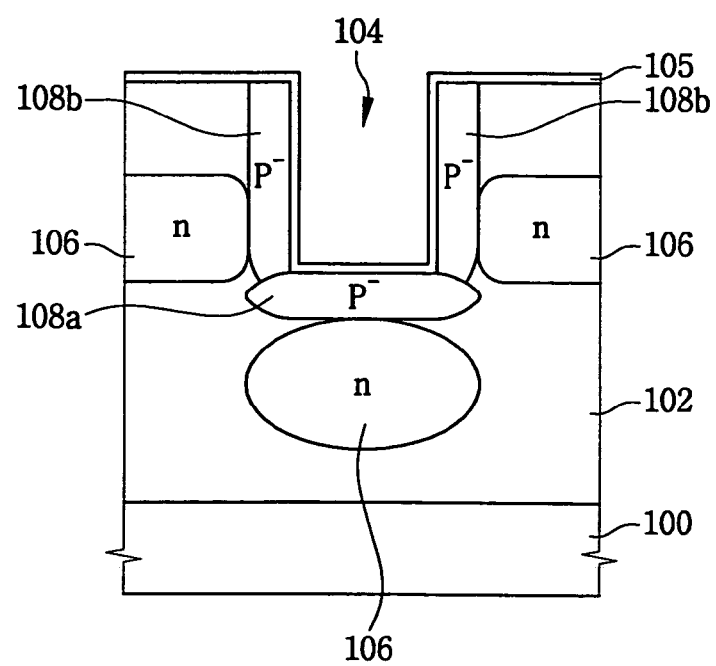

FIG. 3B illustrates processes for forming stopper regions 106 and a first and a second threshold voltage control regions 108a and 108b.

Referring to FIG. 3B, the substrate 100 is thermally treated under an oxygen atmosphere to cure damage to the substrate 100 generated during the etching process for forming the trench 104. As a result, a sacrificial oxide layer 105 is formed on a sidewall of the trench 104, on a bottom face of the trench 104, and on the semiconductor substrate 100. The sacrificial oxide layer 105 is formed in accordance with a reaction between oxygen and silicon that is included in the substrate 100. The sacrificial oxide layer 105 serves as a buffer layer when a subsequent ion implantation process is carried out.

A photoresist pattern (not shown) is formed on the substrate 100 to expose a region of the substrate 100 on which a P-MOS transistor is formed. An N type well 102 is formed in the substrate 100 using first N type impurities, for example, phosphorus (P), by an ion implantation process. Second N type impurities, for example, phosphorus, are implanted into a portion of the N type well 102 by an ion implantation process.

Third N type impurities, for example, arsenic (As), are implanted into the exposed P-MOS transistor region by an ion implantation process to form the stopper regions 106 at portions of the N type well 102 on which source/drain regions 114 and the first threshold voltage control region 108a will be formed. The stopper regions 106 prevent surface depletions of the first and second threshold voltage control regions 108a and 108b. Additionally, the stopper regions 106 prevent diffusions of impurities implanted in the source/drain regions 114.

First P type impurities, for example, boron (B), are implanted into the exposed P-MOS transistor region by an ion implantation process to form the first threshold voltage control region 108a. Here, the first P type impurities are generated from $BF_2$, and implanted into the exposed P-MOS transistor region at an angle of about 0°. In particular, the first P type impurities are implanted into a portion of the substrate 100 beneath the bottom face of the trench 104 to form the first threshold voltage control region 108a. Thus, the first threshold voltage control region 108a is of a P– type.

Second P type impurities, for example, boron (B), are implanted into the exposed P-MOS transistor region by an ion implantation process to form the second threshold voltage control region 108b. Here, the second P type impurities are generated from $BF_2$, and implanted into the exposed P-MOS transistor region at an angle of about 15 to about 45°. Particularly, the second P type impurities are implanted into a portion of the substrate 100 adjacent to the sidewall of the trench 104 to form the second threshold voltage control region 108b. Thus, the second threshold voltage control region 108b is also of a P– type. The second threshold voltage control region 108b adjacent to the sidewall of the trench 104 prevents increase of threshold voltages of the recess channel regions generated near the sidewall of the trench 104 due to the stopper regions 106.

In some embodiments of the present invention, the first and second threshold voltage control regions 108a and 108b may be formed after the stopper regions 106 are formed. Alternatively, the well 102, the stopper regions 106 and the voltage control regions 108a and 108b may be formed before the trench 104 is formed.

Figure 3C:
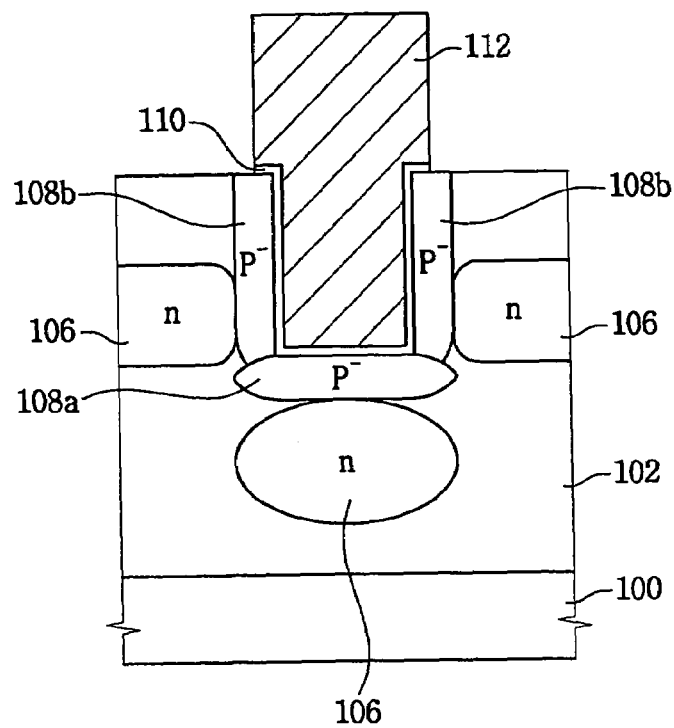

FIG. 3C illustrates a step of forming a gate electrode 112.

Referring to FIG. 3C, after forming the stopper regions 106 and the voltage control regions 108a and 108b, the sacrificial oxide layer 105 is removed from the substrate 100 by a wet etching process.

A gate insulation layer 110 is formed on the bottom face of the trench 104, on the sidewall of the trench 104, and on the substrate 100. The gate insulation layer 110 is formed using silicon oxide. Alternatively, the gate insulation layer 110 may be formed using silicon oxynitride.

After an N+ type polysilicon layer is formed on the semiconductor substrate 100 to fill the trench 104, the N+ type polysilicon layer is patterned by a photolithography process to form the gate electrode 112 of an N+ type filling the trench 104. Here, the trench 104 is filled with a lower portion of the gate electrode 112, whereas an upper portion of the gate electrode 112 protrudes from the substrate 100.

Figure 3D:
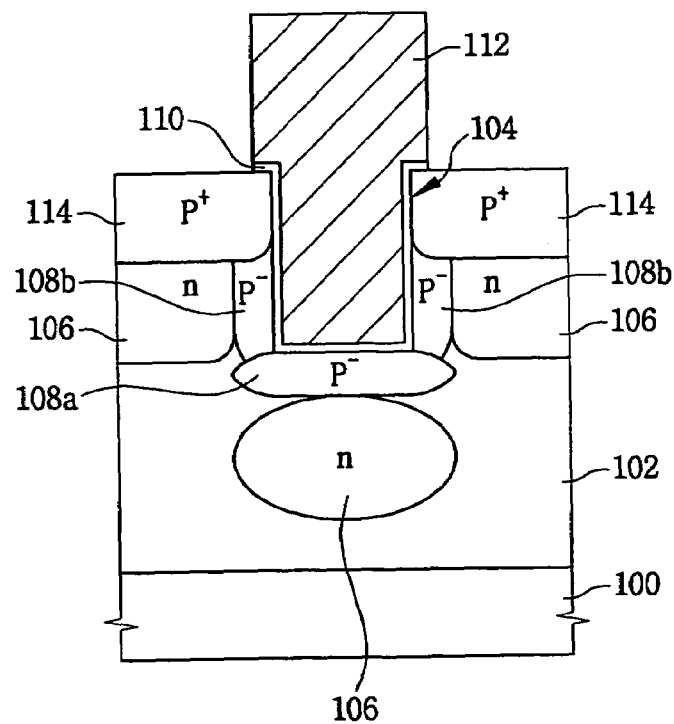

FIG. 3D illustrates a step of forming source/drain regions 114 having P+ types, respectively.

Referring to FIG. 3D, an oxidation process for oxidizing the gate electrode 112 is performed after forming the gate electrode 112. Thus, a sidewall of the gate electrode 112 is oxidized to thereby form a thin gate oxide layer (not shown).

Third P type impurities, for example, boron (B), are implanted into portions of the substrate 100 adjacent to the sidewall of the gate electrode 112 by an ion implantation process. Here, the third P type impurities are generated from $BF_2$, and implanted into the portions of the substrate 100 at an angle of about 0°. Particularly, the third P type impurities are implanted into the portions of the substrate 100 adjacent to the sidewall of the gate electrode 112 to form the source/drain regions 114. Thus, the source/drain regions 114 have P+ types, respectively.

FIGS. 4A to 4D are cross-sectional views illustrating a method of manufacturing a buried channel type P-MOS transistor having a trench gate in accordance with some other embodiments of the present invention. In these embodiments, preliminary source/drain regions having P+ types are formed before forming a trench.

Figure 4A:
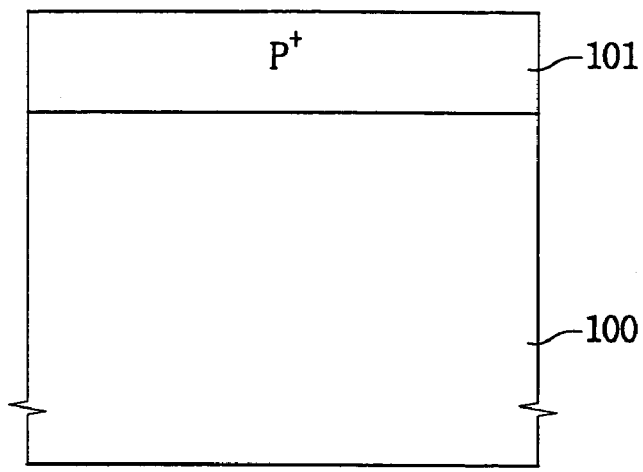
FIGS. 4A to 4D are cross-sectional views illustrating a method of manufacturing a buried channel type P-MOS transistor having a trench gate in accordance with some other embodiments of the present invention.

FIG. 4A illustrates a process of forming the P+ type preliminary source/drain regions 101 on a semiconductor substrate 100.

Referring to FIG. 4A, after the semiconductor substrate 100 having a P type is provided, the semiconductor substrate 100 is divided into an active region and a field region by an isolation process.

The preliminary source/drain regions 101 are formed on the semiconductor substrate 100 using first P type impurities by an ion implantation process. The first P type impurities include boron generated from boron bifluoride ($BF_2$). The preliminary source/drain regions 101 having P+ types prevent the variation of a threshold voltage of a gate electrode when a channel region may not self-aligned respective to the gate electrode because the gate electrode may be misaligned about the trench 104 in a subsequent process.

Figure 4B:
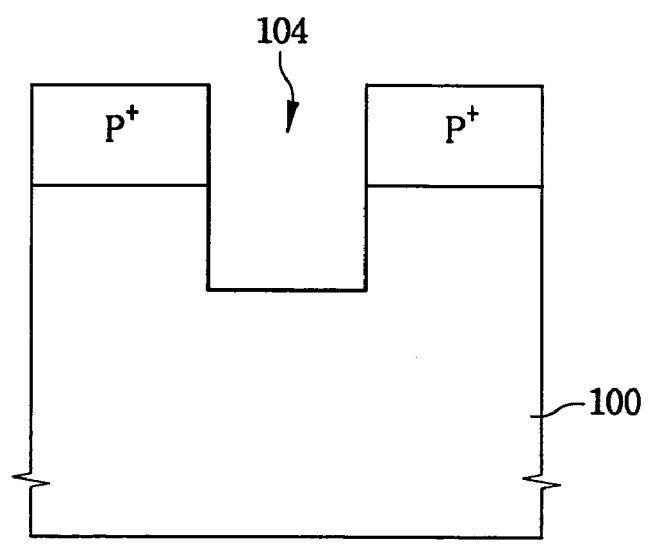

FIG. 4B illustrates a process of forming the trench 104 on the semiconductor substrate 100.

Referring to FIG. 4B, after forming the P+ type preliminary source/drain regions 101, a portion of the substrate 100 is anisotropically etched to form the trench 104 having a depth of about 1,000 to about 1,500 Å. Preferably, the trench 104 has a vertical sidewall.

Figure 4C:
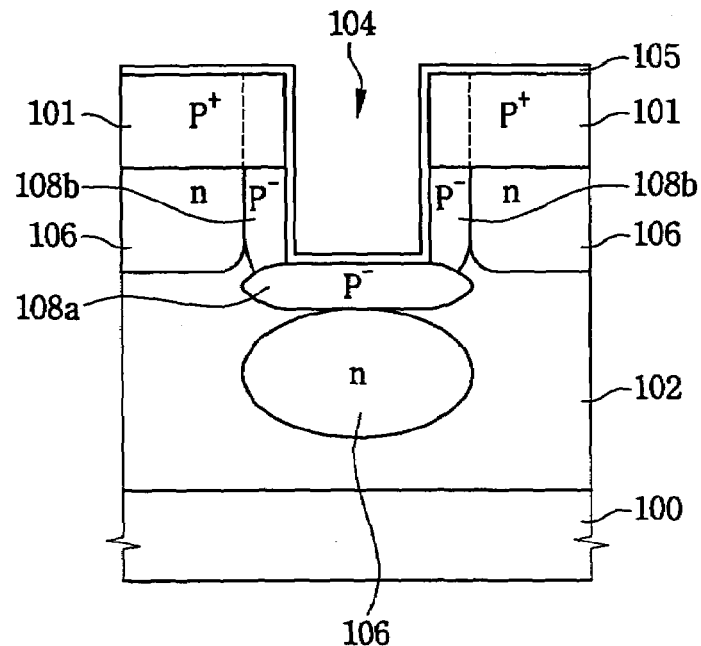

FIG. 4C illustrates processes of forming stopper regions 106 and a first and a second threshold voltage control regions 108a and 108b.

Referring to FIG. 4C, the semiconductor substrate 100 is thermally treated under an oxygen atmosphere to cure the damage to the substrate 100 generated during the etching process for forming the trench 104. As a result, a sacrificial oxide layer 105 is formed on the sidewall of the trench 104, on a bottom face of the trench 104, and on the semiconductor substrate 100. The sacrificial oxide layer 105 is formed in accordance with a reaction between oxygen and silicon included in the substrate 100. The sacrificial oxide layer 105 serves as a buffer layer when a subsequent ion implantation process is carried out.

A photoresist pattern (not shown) is formed on the substrate 100 to expose a region of the substrate 100 on which a P-MOS transistor is formed. An N type well 102 is formed in the substrate 100 using first N type impurities such as phosphorus by an ion implantation process. Second N type impurities such as phosphorus are implanted into a portion of the N type well 102 by an ion implantation process.

Third N type impurities, such as arsenic, are implanted into the exposed P-MOS transistor region to form the stopper regions 106 at portions of the N type well 102 on which source/drain regions 114 and the first threshold voltage control region 108a will be formed. The stopper regions 106 prevent surface depletions of the first and second threshold voltage control regions 108a and 108b. Additionally, the stopper regions 106 prevent diffusions of impurities implanted in the source/drain regions 114.

Second P type impurities such as boron are implanted into the exposed P-MOS transistor region by an ion implantation process to form the first threshold voltage control region 108a. Here, the second P type impurities are generated from $BF_2$, and implanted into the exposed P-MOS transistor region at an angle of about 0°. In particular, the second P type impurities are implanted into a portion of the substrate 100 beneath the bottom face of the trench 104 to form the first threshold voltage control region 108a. Thus, the first threshold voltage control region 108a has P– type.

Second P type impurities such as boron are implanted into the exposed P-MOS transistor region by an ion implantation process to form the second threshold voltage control region 108b. Here, the second P type impurities are generated from boron bifluoride ($BF_2$), and implanted into the exposed P-MOS transistor region at an angle of about 15 to about 45°. Particularly, the second P type impurities are implanted into a portion of the substrate 100 adjacent to the sidewall of the trench 104 to form the second threshold voltage control region 108b. Thus, the second threshold voltage control region 108b also has P– type. The second threshold voltage control region 108b adjacent to the sidewall of the trench 104 prevents increase of threshold voltages of the recess channel regions generated near the sidewall of the trench 104 due to the stopper regions 106.

In this embodiment, the first and second threshold voltage control regions 108a and 108b may be formed after the stopper regions 106 are formed. Alternatively, the well 102, the stopper regions 106, and the voltage control regions 108a and 108b may be formed before the trench 104 is formed.

Figure 4D:
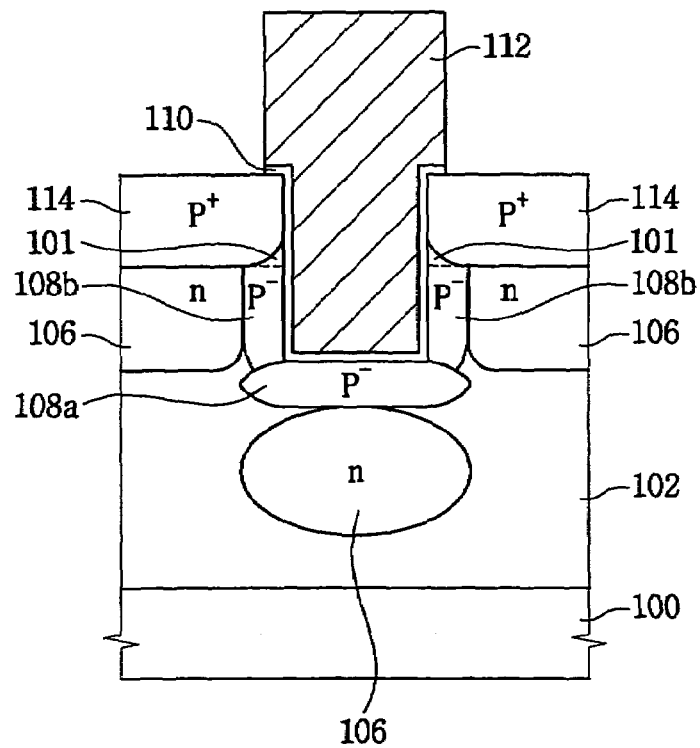

FIG. 4D illustrates processes of forming a gate electrode 112 and the source/drain regions 114 having P+ types.

Referring to FIG. 4D, after forming the stopper regions 106 and the voltage control regions 108a and 108b, the sacrificial oxide layer 105 is removed from the substrate 100 by a wet etching process.

A gate insulation layer 110 is formed on the bottom face of the trench 104, on the sidewall of the trench 104 and on the substrate 100. The gate insulation layer 110 is formed using silicon oxide. Alternatively, the gate insulation layer 110 may be formed using silicon oxynitride.

After an N+ type polysilicon layer is formed on the semiconductor substrate 100 to fill the trench 104, the N+ type polysilicon layer is patterned by a photolithography process to form the gate electrode 112 of an N+ type filling the trench 104. Here, the trench 104 is filled with a lower portion of the gate electrode 112, whereas an upper portion of the gate electrode 112 protrudes from the substrate 100.

An oxidation process for oxidizing the gate electrode 112 is performed after forming the gate electrode 112. Thus, a sidewall of the gate electrode 112 is oxidized to form a thin gate oxide layer (not shown).

Fourth P type impurities, such as boron, are implanted into portions of the substrate 100 adjacent to the sidewall of the gate electrode 112 by an ion implantation process. Here, the fourth P type impurities are generated from boron bifluoride ($BF_2$), and implanted into the portions of the substrate 100 at an angle of about 0°. In particular, the fourth P type impurities are implanted into the portions of the substrate 100 adjacent to the sidewall of the gate electrode 112 to form the source/drain regions 114. Thus, the source/drain regions 114 have P+ types.

Figure 5:
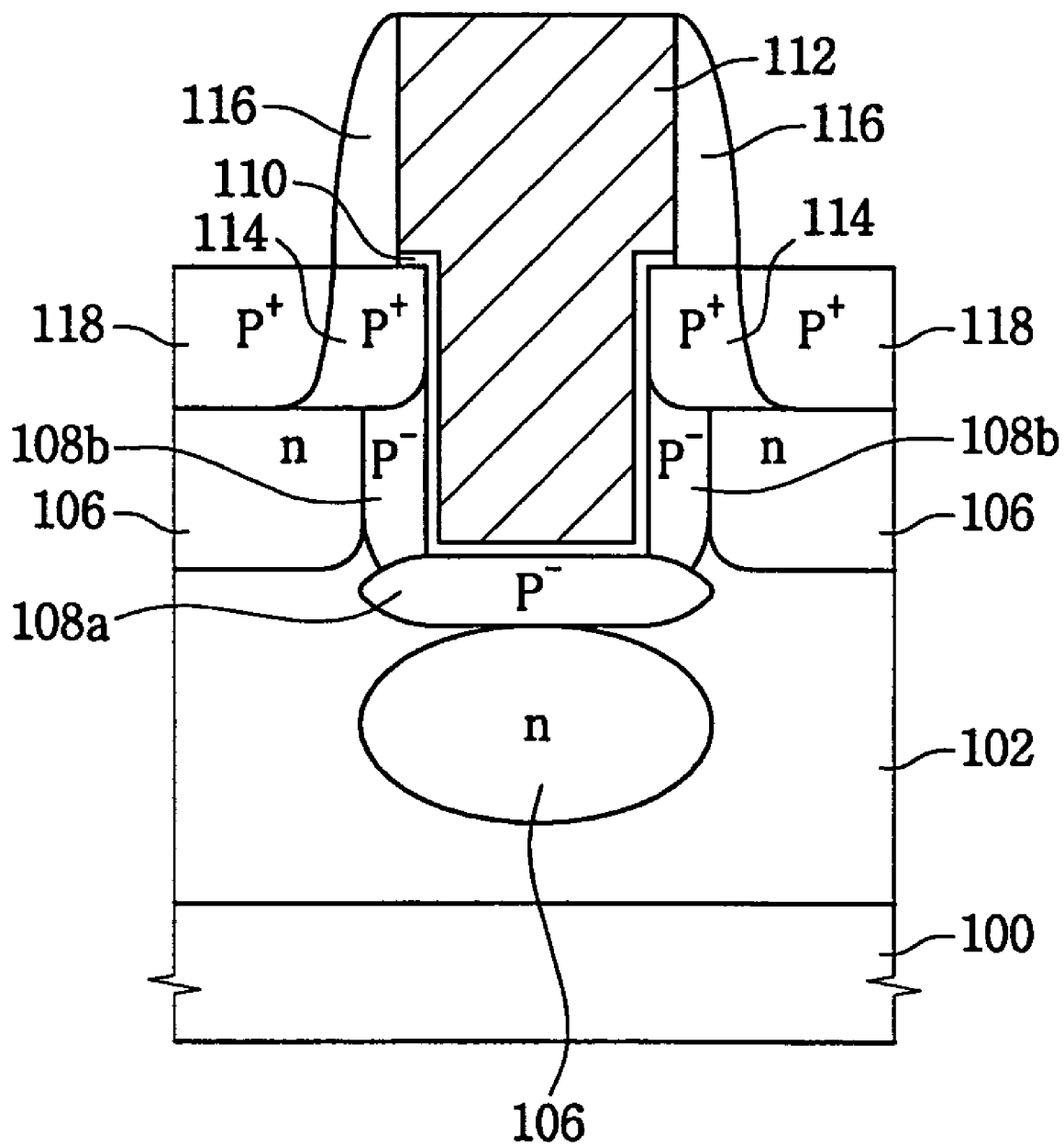
FIG. 5 is a cross-sectional view illustrating a buried channel type P-MOS transistor having a trench gate in accordance with other embodiments of the present invention.

FIG. 5 is a cross-sectional view illustrating a buried channel type P-MOS transistor having a trench gate in accordance with other embodiments of the present invention. In this embodiment, the buried channel type P-MOS transistor includes a gate spacer 116 on a sidewall of a gate electrode 112.

In a method of manufacturing the buried channel type P-MOS transistor, an insulation layer is formed on a semiconductor substrate 100 after forming a trench 104, stopper regions 106, a first and a second threshold voltage control regions 108a and 108b, a gate electrode 112, and first P+ type source/drain regions 114 as described with reference to FIGS. 3A to 3D.

The insulation layer is anisotropically etched to form the gate spacer 116 on the sidewall of the gate electrode 112. The gate spacer 116 prevents impurities for forming second source/drain regions 118 from implanting into a channel region when the gate electrode 112 may be mis-aligned relative to the trench 104.

Using the gate spacer 116 and the gate electrode 112 as masks, P type impurities such as boron are implanted into portions of the substrate 100 adjacent to the gate electrode 112 by an ion implantation process. Here, the P type impurities are generated from BF2, and implanted into the portions of the substrate 100 at an angle of about 0°. Therefore, the second source/drain regions 118 having P+ types are formed adjacent to the gate electrode 112. Alternatively, P+ type preliminary source/drain regions may be formed on the substrate 100 before the trench 104 is formed, as described above.

Figure 6A:
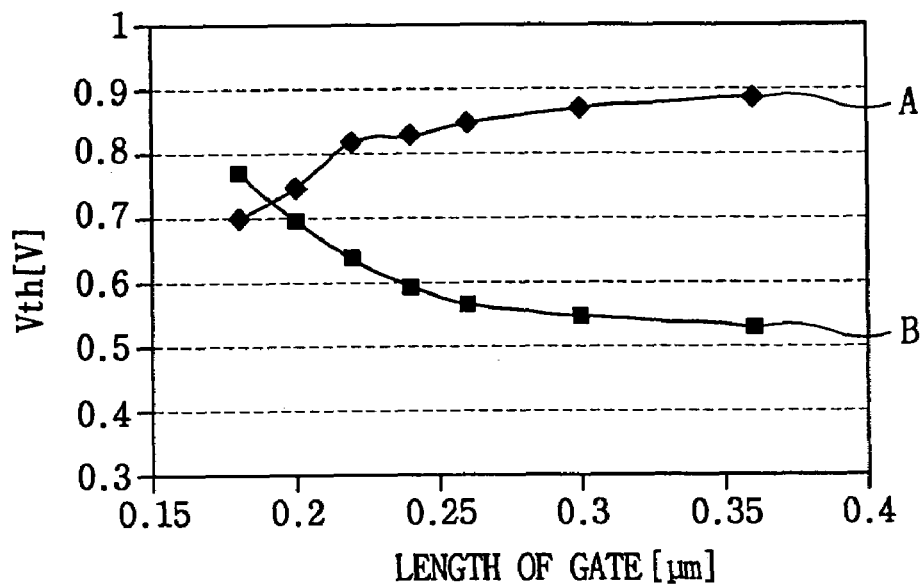
FIGS. 6A and 6B are graphs illustrating electrical characteristics of a buried channel type P-MOS transistor according to some embodiments of the present invention in comparison with the conventional buried channel type P-MOS transistor.
Figure 6B:
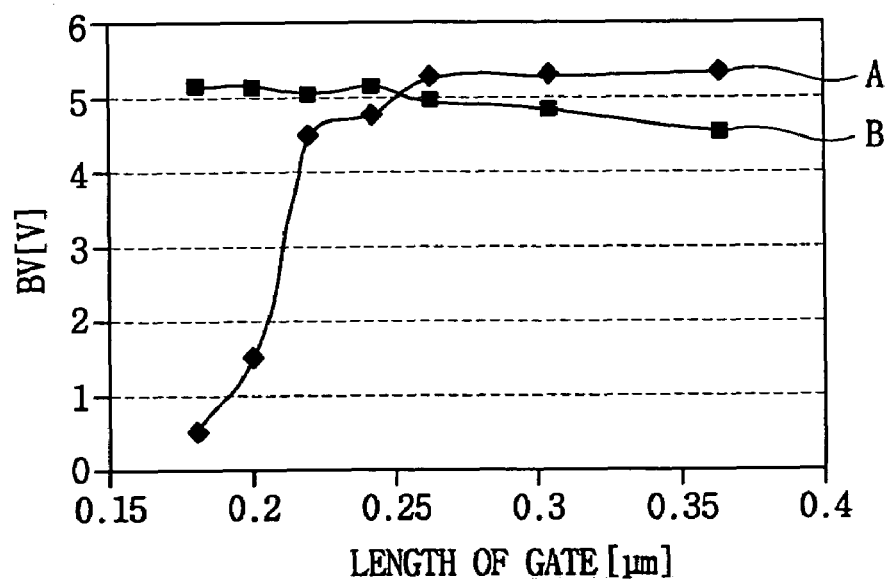

FIGS. 6A and 6B are graphs illustrating the electrical characteristics of a buried channel type P-MOS transistor according to some embodiments of the present invention in comparison with the conventional buried channel type P-MOS transistor. FIG. 6A shows threshold voltages (Vth) of the buried channel type P-MOS transistors relative to the length of gates thereof, and FIG. 6B shows breakdown voltages (BV) between source/drain regions of the buried channel type P-MOS transistors relative to the length of the gates thereof. In FIGS. 6A and 6B, lines "A" represent the electrical characteristics of the conventional buried channel type P-MOS transistor, whereas lines "B" indicate the electrical characteristics of the buried channel type P-MOS transistor in accordance with some embodiments of the present invention.

Referring to FIG. 6A, the threshold voltage (A) of the conventional buried channel type P-MOS transistor in FIG. 1 rapidly decreases because of the short channel effect when the length of the gate is reduced to below about 0.25 μm. However, the threshold voltage (B) of the buried channel type P-MOS transistor according to some embodiments of the present invention is increased when the length of the gate is reduced because the gate effectively controls the recess type channel regions formed adjacent to the sidewall and the bottom face of the trench 104 as shown in FIG. 2.

Referring to FIG. 6B, the breakdown voltage (A) between the source/drain regions of the conventional buried channel type P-MOS transistor is rapidly reduced due to a punch-through effect when the length of the gate is decreased to below about 0.25 μm. On the other hand, a relatively constant breakdown voltage (B) between the source/drain regions of the buried channel type P-MOS transistor according to some embodiments of the present invention is maintained although the length of the gate is reduced because the recess type channel regions are effectively adjusted by the gate. For example, when the length of the gate is about 0.2 μm, the buried channel type P-MOS transistor of the present invention has an excellent breakdown voltage of about 5V despite of a relatively low threshold voltage of about 0.7V in comparison with the conventional buried channel type P-MOS transistor.

According to some embodiments of the present invention, after first type threshold voltage control regions are formed in portions of a substrate adjacent to a sidewall and a bottom face of a trench (that is, recess type channel regions), second type stopper regions are formed beneath source/drain regions and the first type threshold voltage control regions. The second type stopper regions prevent surface depletions of the first type threshold voltage control regions adjacent to the sidewall and bottom face of the trench. The second type stopper regions also prevent diffusion of impurities included in the source/drain regions.

In addition, first type impurities are implanted into a portion of the substrate adjacent to the sidewall of the trench to form a threshold voltage control region that prevents the increase of a threshold voltage of the channel region formed adjacent to the sidewall of the trench due to the formation of the stopper regions.

Furthermore, a buried channel type transistor having the recess type channel regions may be easily manufactured because several ion implantation processes for the formations of a well, the stopper regions, source/drain regions may be performed in one chamber. Namely, manufacturing processes for the buried channel type transistor having the recess type channel regions may be simplified.

Having thus described exemplary embodiments of the present invention, it is to be understood that the invention defined by the appended claims is not to be limited by particular details set forth in the above description as many apparent variations thereof are possible without departing from the spirit or scope of the invention as defined in the attached claims.

We claim:

1. A method of manufacturing a buried channel type transistor comprising:
   providing a semiconductor substrate with a trench of a predetermined depth from a surface of the semiconductor substrate;
   forming stopper regions at portions of the substrate wherein each of the stopper regions has a first conduction type;
   forming a first and a second threshold voltage control regions at portions of the substrate beneath a bottom face of the trench and adjacent to a sidewall of the trench, respectively, wherein each of the threshold voltage control regions has a second conduction type opposite that of the first conduction type;
   forming a gate electrode filling the trench; and
   forming source/drain regions at portions of the substrate adjacent to a sidewall of the gate electrode wherein each of the source/drain regions has the second conduction type.

2. The method of claim 1, wherein the first conduction type is an N type and the second conduction type is a P type.

3. The method of claim 1, further comprising forming preliminary source/drain regions on the substrate before forming the trench wherein each of the preliminary source/drain regions has the second conduction type.

4. The method of claim 1, further comprising, after forming the trench, forming a well having the first conduction type in the substrate.

5. The method of claim 1, wherein forming the first and the second threshold voltage control regions comprises:
   forming the first threshold voltage control region at the portion of the substrate beneath the bottom face of the trench by substantially perpendicularly implanting first impurities of the second conduction type; and
   forming the second threshold voltage control region at the portion of the substrate adjacent to the sidewall of the trench by implanting second impurities of the second conduction type.

6. The method of claim 5, wherein the second impurities are implanted at an angle of about 15 to about 45°.

7. The method of claim 1, wherein the stopper regions are formed after the first and second threshold voltage control regions are formed.

8. The method of claim 1, further comprising, before forming the gate electrode, forming a gate insulation layer on the sidewall and the bottom face of the trench and on the substrate.

9. The method of claim 1, wherein the gate electrode extends substantially perpendicular relative to the substrate.

10. The method of claim 1, further comprising, after forming the source/drain regions, forming a gate spacer on a sidewall of the gate electrode.

11. The method of claim 10, wherein the source/drain regions are formed after the gate spacer is formed.

12. A method comprising:
   etching a semiconductor substrate to a predetermined depth from a surface of the semiconductor substrate to form a trench;
   implanting impurities of a first conductivity type into the substrate to form a first stopper region beneath a bottom surface of the trench and a second stopper region adjacent to a sidewall of the trench;
   implanting impurities of a second conductivity type into the substrate to form a first threshold voltage control region between the first stopper region and the bottom surface and to form a second threshold voltage control region between the second stopper region and the sidewall;
   filling the trench with a polysilicon layer having the first conductivity type;
   patterning the polysilicon layer to form a gate electrode, the gate electrode having a lower portion that fills the trench and an upper portion that protrudes above the surface of the semiconductor substrate; and
   implanting impurities of the second conductivity type into the substrate to form a source/drain region, the source/drain region contacting an upper surface of the second stopper region, an upper surface of the second threshold voltage control region, and the sidewall.

13. The method of claim 12, wherein etching the semiconductor substrate comprises etching the substrate so that the bottom surface and the sidewall are substantially perpendicular.

14. The method of claim 13, wherein implanting impurities to form the first and second stopper regions comprises implanting n type impurities, wherein implanting impurities to form the first and second threshold voltage control regions comprises implanting $P^{31}$ type impurities, and wherein implanting impurities to form the source/drain region comprises implanting $P^+$ type impurities.

* * * * *

UNITED STATES PATENT AND TRADEMARK OFFICE
CERTIFICATE OF CORRECTION

PATENT NO. : 7,060,574 B2  Page 1 of 1
APPLICATION NO. : 10/839951
DATED : June 13, 2006
INVENTOR(S) : Ji-Young Kim et al.

It is certified that error appears in the above-identified patent and that said Letters Patent is hereby corrected as shown below:

Column 12, line 33, the word "$P^{31}$" should read -- $P^-$ --.

Signed and Sealed this

Eleventh Day of August, 2009

David J. Kappos
*Director of the United States Patent and Trademark Office*